United States Patent
Tsai et al.

(10) Patent No.: US 7,498,607 B2
(45) Date of Patent: Mar. 3, 2009

(54) EPI-STRUCTURE WITH UNEVEN MULTI-QUANTUM WELL AND THE METHOD THEREOF

(75) Inventors: Tzong-Liang Tsai, Taichung (TW); Chih-Ching Cheng, Taichung (TW)

(73) Assignee: Huga Optotech Inc., Taichung (TW)

( * ) Notice: Subject to any disclaimer, the term of this patent is extended or adjusted under 35 U.S.C. 154(b) by 145 days.

(21) Appl. No.: 11/798,750

(22) Filed: May 16, 2007

(65) Prior Publication Data

US 2008/0191190 A1  Aug. 14, 2008

(30) Foreign Application Priority Data

Feb. 9, 2007   (TW) .............................. 96104691 A (51) Int. Cl.
- H01L 29/22 (2006.01)
- H01L 33/00 (2006.01)
- H01L 29/24 (2006.01)

(52) U.S. Cl. ........................... 257/94; 257/96; 257/103; 257/E33.062; 257/E33.074

(58) Field of Classification Search .................. 257/94, 257/96, 103, E33.062, E33.074
See application file for complete search history.

(56) References Cited

U.S. PATENT DOCUMENTS

| | | | |
|---|---|---|---|
| 5,779,924 A | 7/1998 | Krames et al. | |
| 6,501,101 B2 | 12/2002 | Murakami et al. | |
| 6,777,871 B2 | 8/2004 | Duggal et al. | |
| 6,821,804 B2 | 11/2004 | Thibeault et al. | |
| 6,861,663 B2 | 3/2005 | Sawazaki et al. | |
| 6,900,473 B2 | 5/2005 | Yoshitake et al. | |
| 7,345,311 B2* | 3/2008 | Ishida et al. | 257/79 |
| 2002/0104997 A1 | 8/2002 | Kuo et al. | |
| 2003/0183832 A1* | 10/2003 | Ishida et al. | 257/94 |
| 2004/0104672 A1 | 6/2004 | Shiang et al. | |
| 2005/0032344 A1 | 2/2005 | Hatano et al. | |
| 2005/0082562 A1 | 4/2005 | Ou et al. | |
| 2005/0277218 A1 | 12/2005 | Nakajo et al. | |
| 2006/0081861 A1 | 4/2006 | Wu et al. | |
| 2007/0051962 A1 | 3/2007 | Lai | |
| 2007/0085093 A1* | 4/2007 | Ohmae et al. | 257/89 |
| 2007/0096116 A1* | 5/2007 | Yasuda et al. | 257/79 |
| 2008/0008964 A1* | 1/2008 | Chan et al. | 430/270.13 |
| 2008/0128727 A1* | 6/2008 | Erchak et al. | 257/98 |
| 2008/0197378 A1* | 8/2008 | Kong et al. | 257/103 |

* cited by examiner

*Primary Examiner*—Ngan Ngo
(74) *Attorney, Agent, or Firm*—Reed Smith LLP; Juan Carlos A. Marquez, Esq.

(57) ABSTRACT

An Epi-Structure of light-emitting device, comprising: a first semiconductor conductive layer forming on a substrate; an active layer forming on a first semiconductor conductive layer with Multi-Quantum Well (MQW); and a second semiconductor conductive layer forming on the active layer; wherein a plurality of particles formed by at least one hetero-material are scattered between the first semiconductor conductive layer and the active layer in order to form an uneven Multi-Quantum Well.

24 Claims, 11 Drawing Sheets

EPI-STRUCTURE WITH UNEVEN MULTI-QUANTUM WELL AND THE METHOD THEREOF

BACKGROUND OF THE INVENTION

1. Field of the Invention

The present invention is related to an epi-structure of a light-emitting device, especially related to an epi-structure having a plurality of uneven multiple quantum well (MQW) applied to a light-emitting device.

2. Background of the Related Art

It is known that light in all direction is emitted by the active layer of a light-emitting device (Light-Emitting Device; LED), and the efficiency of a LED may be acquired by the following equation:

$$E_{\mathit{eff}} = Ei(\text{internal}) * Ee(\text{external})$$

where Ei represents the internal efficiency from an active layer and Ee represents the external efficiency.

Figure 1A:
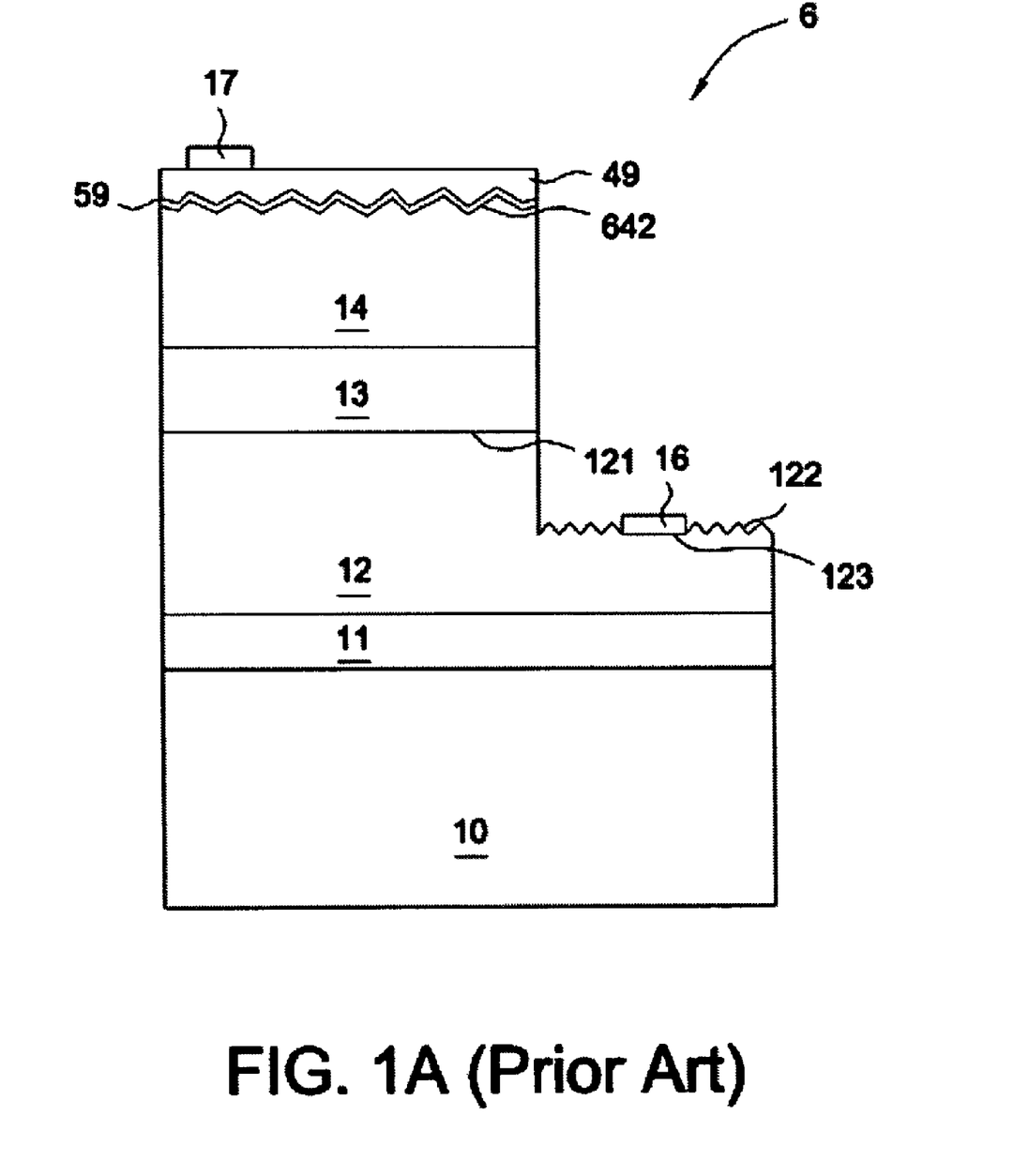
FIG. 1A, FIG. 1B, FIG. 1C and FIG. 1D are diagrams illustrating conventional LED.
Figure 1B:
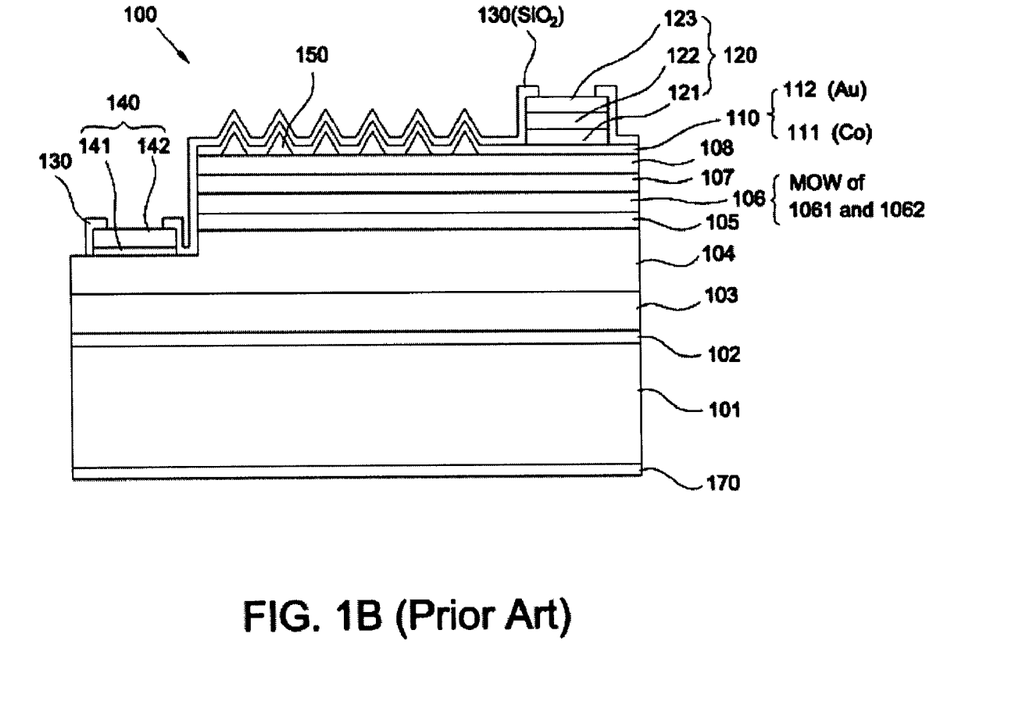
Figure 1C:
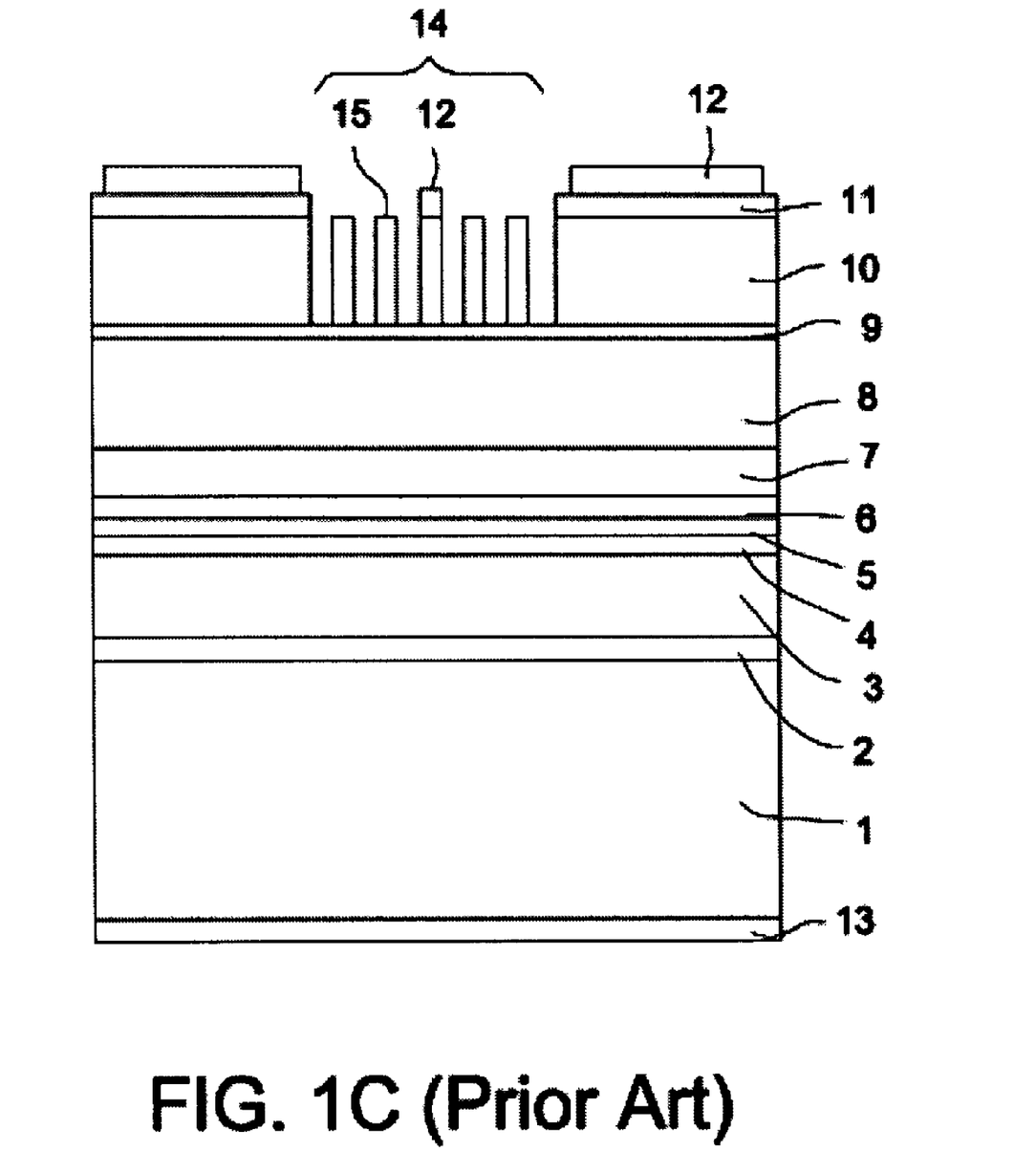
Figure 1D:
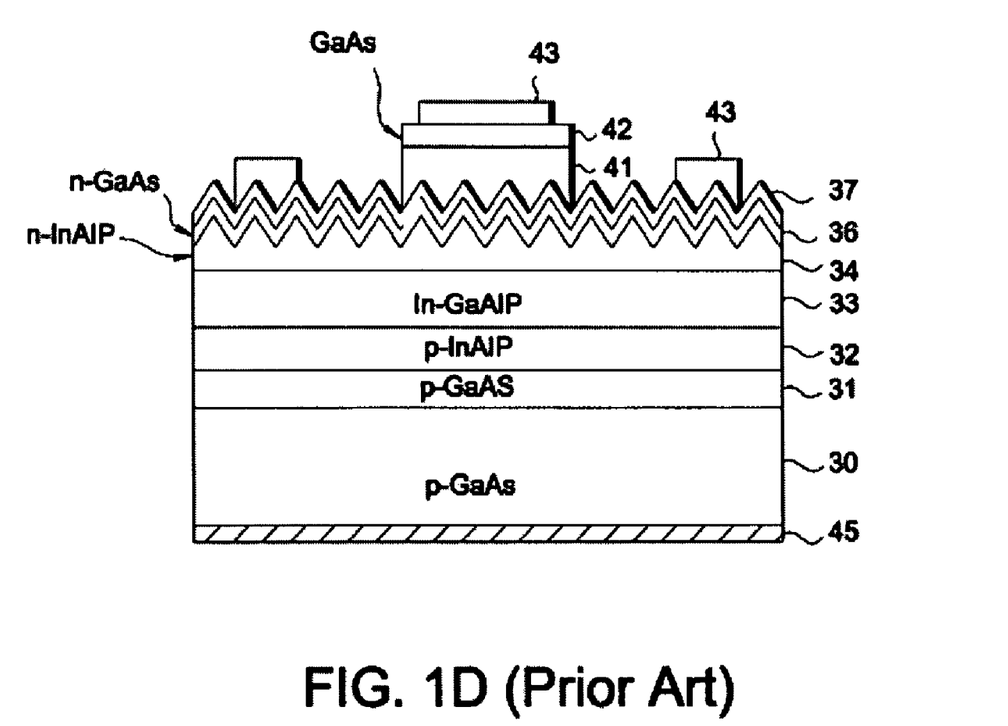

Typical efficiency improvement of a LED focuses on the improvement of external efficiency, for example, FIG. 1A from US Publication No. US20050082562A1, FIG. 1B form US Publication No. US20050277218A1, FIG. 1C from US Publication No. US20040104672, FIG. 1D form US Publication No. 6900473 and US67777871. The improvement aforementioned focus on the surface of a LED by forming uneven surface (by etching) on the external side of a LED to prevent light in a chip from total reflection, so as to enhance external efficiency Ee. Accordingly, Ee is enhanced reached 80%, which is physical limitation.

Typically, the Ei from an internal active layer is reached about 40%. The whole efficiency $E_{\mathit{eff}}$ of a LED may be improved by enhancing Ei. Accordingly, the present invention provides the active layer of a LED with uneven multiple quantum well. The volumetric area of uneven MQW is more than a conventional smooth MQW, which may enhance the Ei from an internal active layer and further improve the whole efficiency $E_{\mathit{eff}}$ of a LED.

SUMMARY OF THE INVENTION

In order to solve the problems mentioned above, the present invention provides an epi-structure with uneven multiple quantum well (uneven MQW) and the formation thereof. The volumetric area of uneven MQW is more than a conventional smooth MQW, which may enhance the Ei from an internal active layer and further improve the whole efficiency $E_{\mathit{eff}}$ of a LED.

One of objects of the present invention provides an epi-structure with uneven multiple quantum well (uneven MQW) and the formation thereof for improving the efficiency of a LED.

Another one of objects of the present invention provides an epi-structure with uneven multiple quantum well (uneven MQW), whereby forms better beam pattern.

Accordingly, the present invention provides an epi-structure applied to a light-emitting device, which includes: a first semiconductor conductive layer formed on a substrate; an active layer with multiple quantum wells formed on the first semiconductor conductive layer; and a second semiconductor conductive layer formed on the active layer, wherein a plurality of particles made from at least one hetero-material are scattered between the first semiconductor conductive layer and the active layer and configured for formation of the uneven multiple quantum well.

The present invention further provides a light-emitting device, which includes: first electrode formed on the first surface of a substrate; a first semiconductor conductive layer formed on the of the substrate; an active layer with multiple quantum wells formed on the first semiconductor conductive layer, wherein a plurality of particles made from at least one hetero-material are scattered between the first semiconductor conductive layer and the active layer and configured for formation of the uneven multiple quantum well; next a second semiconductor conductive layer formed on the active layer; a transparent conductive layer formed on the second semiconductor conductive layer; next a second electrode formed on the transparent conductive layer.

The present invention further provides an epi-structure with multiple quantum well, which includes: a semiconductor conductive layer formed on a substrate; a multiple quantum well formed on the semiconductor conductive layer, wherein a plurality of particles made from at least one hetero-material are scattered between the first semiconductor conductive layer and the active layer and configured for formation of the uneven multiple quantum well.

The present invention further provides an epi-method applied to a light-emitting device, which includes: providing a substrate; forming a first semiconductor conductive layer on the substrate; forming an active layer on the first semiconductor conductive layer, wherein the active layer has a plurality of multiple quantum well, and at least one hetero-material are scattered between the first semiconductor conductive layer and the active layer and configured for formation of the uneven multiple quantum well; and forming a second semiconductor conductive layer on the active layer.

DETAILED DESCRIPTION OF THE INVENTION

The present invention provides an epi-structure with uneven multiple quantum well (uneven MQW) and the formation thereof. Following illustrations describe detailed epi-structure and the formation thereof for understanding the present invention. Obviously, the present invention is not limited to the embodiments of epi-structure, however, the preferable embodiments of the present invention are illustrated as followings. Besides, the present invention may be applied to other embodiments, not limited to ones mentioned.

Following paragraphs illustrate multiple quantum well epi-structure with a plurality of the uneven surface and epi-structure for light-emitting device with uneven multiple quantum well in the present invention. Next, a formation for a high-brightness light-emitting device in the present invention is illustrated herein. Besides, in the present invention, the forming method of nitride semiconductor growth may be a method of analog vapor phase, such as Metal Organic Vapor Phase Epitaxial (MOVPE), Hydride Vapor Phase Epitaxy (HVPE), Molecular beam epitaxy (MBE), Metal organic chemical vapor deposition (MOCVD) or two-step MOCVD. Thus, in the present invention, the forming method of nitride semiconductor growth is not limited to, the structures or methods with an epi-structure of the present invention are with the claimed scope of the present invention.

Figure 2:
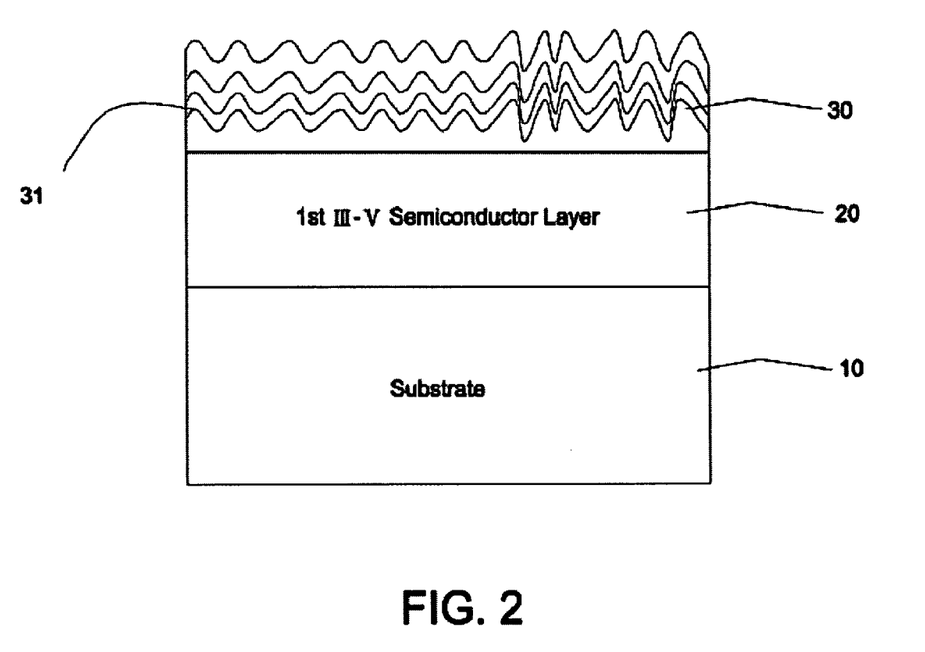
FIG. 2 is a cross-sectional diagram illustrating an epi-structure of light-emitting device with uneven multiple quantum well according to the present invention.

First, FIG. 2 is a cross-sectional diagram illustrating a epi-structure with a plurality of the uneven surface according to the present invention. Shown in FIG. 2, an epi-structure includes a substrate 10, such as the substrate 10 made from sapphire (C, M, R or A surface), which is set in a reactor of MOVPE. Next, a semiconductor conductive layer 20 is formed on the substrate 10, such as a semiconductor conductive layer formed from III-V group material compound (III-V compound semiconductor layer), especially a nitride-based nitride semiconductor conductive layer, such as GaN. Next, a plurality of the particles made from one or more kinds of hetero-materials are added in the reactor of MOVPE. The plurality of the particles of hetero-material are randomly scattered on the nitride semiconductor conductive layer 20. It is noted that there is no limitation on the kinds of added hetero-material, as long as one different from the material of nitride semiconductor conductive layer 20. For example, when the nitride semiconductor conductive layer 20 is made from GaN material, the hetero-material may be the III group in periodic table including boron (B), aluminum (Al), gallium (Ga), indium (In), thallium (Tl), or the V group including: nitrogen (N), phosphorous (P), arsenic (As), antimony (Sb), bismuth (Bi), or the II group including: beryllium (Be), magnesium (Mg), calcium (Ca), strontium (Sr), barium (Ba), radium (Ra) or the VI group including: oxygen (O), sulfur (S), selenium (Se), tellurium (Te), barium (Po) or the III-V group compound, II-VI group compound or II-V group compound (such as $Mg_3N_2$) or silicon nitride ($SiN_x$), and so on.

Figure 6:
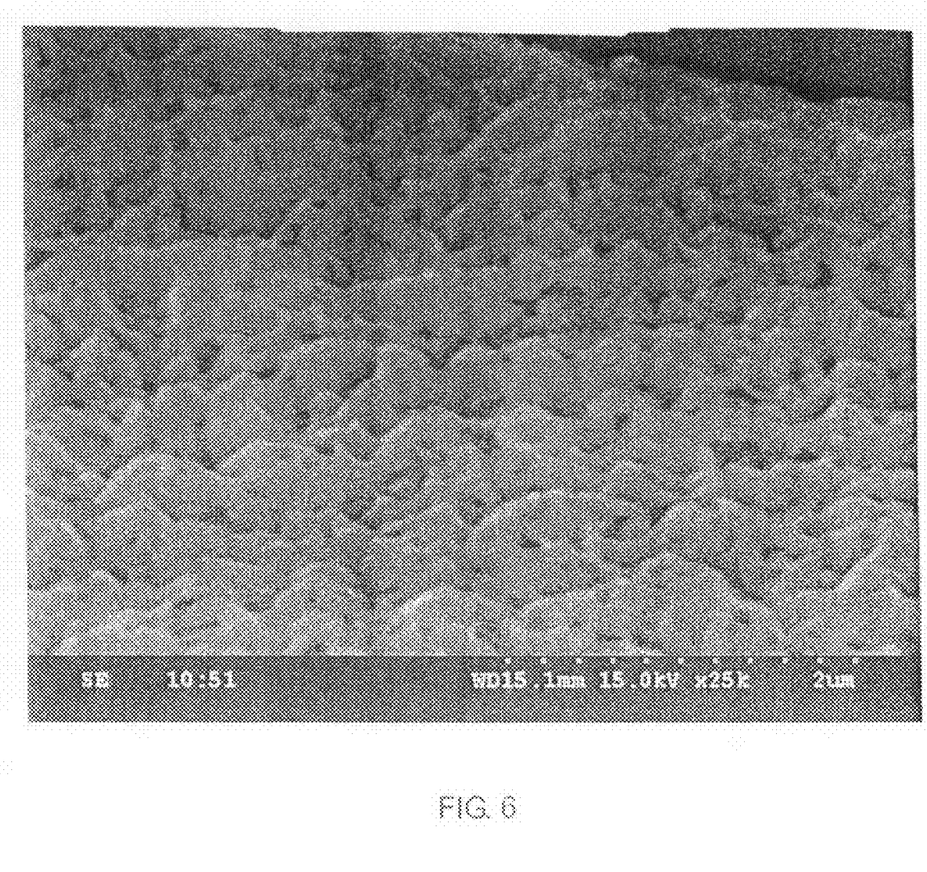
FIG. 6 shows a SEM diagram of uneven multiple quantum well according to the present invention.
Figure 7:
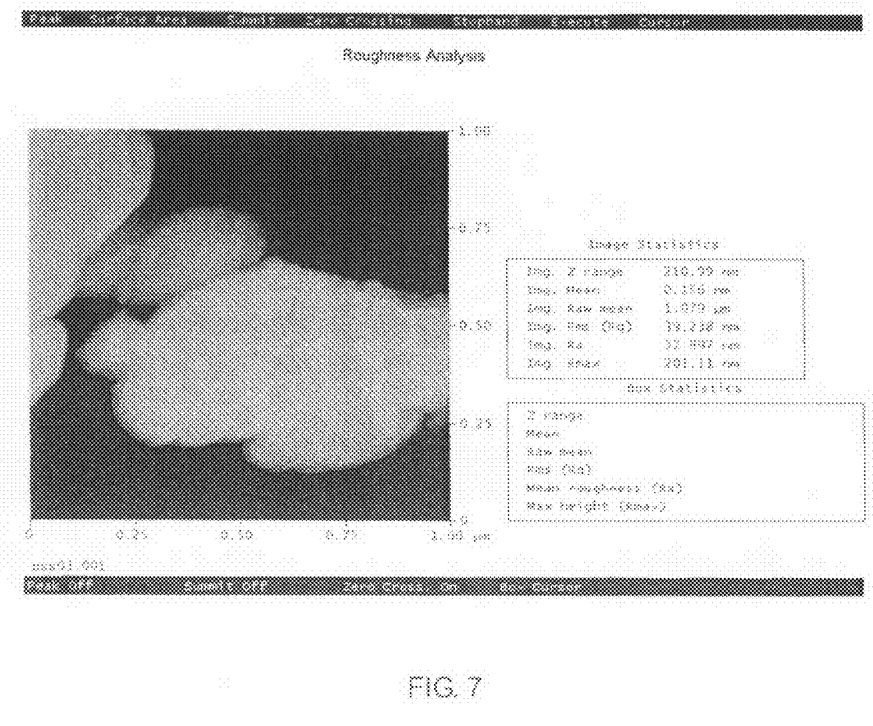
FIG. 7 shows an AFM diagram of uneven multiple quantum well according to the present invention.

Next, the growth of the multiple quantum well (MQW) is executed. Before the growth of the multiple quantum well, some positions on the nitride semiconductor conductive layer 20 have been covered by the added hetero-material, thus, the positions may block the growth of the multiple quantum well or decrease the growth rate of the multiple quantum well during the growth of the multiple quantum well. Under the condition aforementioned, there are cavities, such as unevenness 31, formed on the positions in the existence of the hetero-material. The plurality of the unevenness 31 are similar to an area of sand dune on a beach, which have individual height and width and may not connected each another, referring to a SEM of FIG. 6. In the present invention, any one of the uneven multiple quantum well has a cross section with a ratio of width to height in a range between 3 to 1 and 1 to 10, and has a surface roughness Ra in a range between 0.5 and 50 nanometers. Preferably, the surface roughness Ra is in the range between 30 and 40 nanometers, referring to the AFM diagram of FIG. 7.

Furthermore, for the substrate 10, in addition to sapphire of C surface, M surface, R surface or A surface, it may be made from spinel ($MgAl_2O_4$)-based insulating substrate, such as SiC (containing 6H, 4H, 3C), GaAs, AlN, GaN, GaP, Si, ZnO, MgO, LAO, LGO, glass material or GaN, and so on. The nitride semiconductor conductive layer 20 may be made from the material selected from the groups: AlN, GaN, InN, AlGaN, InGaN and InAlGaN. The uneven multiple quantum well 30 is made from the material selected from the groups: AlN, GaN, InN, AlGaN, InGaN and InAlGaN.

Figure 3:
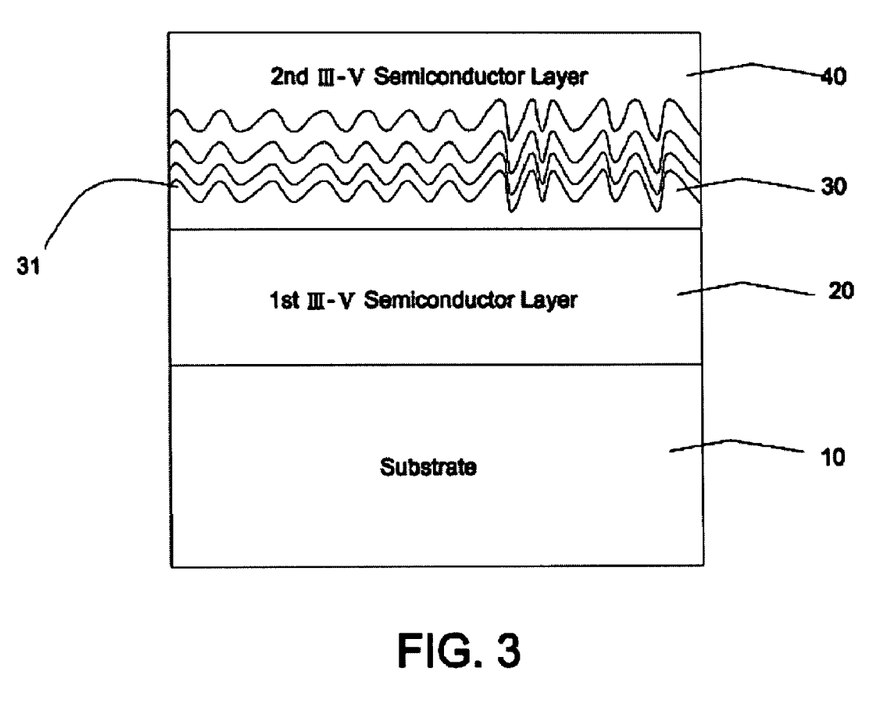
FIG. 3 is a cross-sectional diagram illustrating an epi-structure of light-emitting device with uneven multiple quantum well according to the present invention.

Next, FIG. 3 is a cross-sectional diagram illustrating the epi-structure with uneven multiple quantum well applied to a light-emitting device according to the present invention. Shown in FIG. 3, an epi-structure includes the substrate 10, the first semiconductor conductive layer 20 formed on substrate 10 and active layer 30 formed on the first semiconductor conductive layer 20. The active layer 30 are formed with uneven multiple quantum well. It is noted that, in the present invention, the active layer 30 with uneven multiple quantum well is identical to one shown in FIG. 2. That is, a plurality of the grain made from a plurality of the hetero-material are scattered on the first semiconductor conductive layer 20 for forming the uneven multiple quantum well 30. Thus, in the present invention, the first semiconductor conductive layer 20 or the active layer 30 with uneven multiple quantum well or both are made from at least one hetero-material (not shown in the figure). Next, a second semiconductor conductive layer 40 is formed on the active layer 30. Obviously, in a typical structure of forming a light-emitting device, an N-type semiconductor conductive layer and a P-type semiconductor conductive layer are formed on the top and bottom surfaces of the active layer, such that electrons in the N-type semiconductor conductive layer and electrical holes in the P-type semiconductor conductive layer may be biased and then driven to the active layer for recombination to emit light. Thus, the epi-structure of a light-emitting device in the present invention, the first semiconductor conductive layer 20 or the second semiconductor conductive layer 40 is not limited to the N-type semiconductor conductive layer and P-type semiconductor conductive layer. Any material which is enable of forming typical structure of a light-emitting device may be used in the present invention, such as the second semiconductor conductive layer 40 of N-type semiconductor conductive layer associated with the first semiconductor conductive layer 20 of P-type semiconductor conductive layer. Meanwhile, the epi-structure of the light-emitting device in the present invention is applied to a typical epi-structure of light-emitting diode (LED), LASER or VCSEL, and so on.

Similarly, in the embodiment of FIG. 3 in the present invention, in addition to sapphire of C surface, M surface, R surface or A surface as a main surface, the substrate 10 may be made from an insulating material such as spinel ($MgAl_2O_4$), SiC (containing 6H, 4H, 3C), GaAs, AlN, GaP, Si, ZnO, MgO, LAO, LGO or glass material or GaN, and so on. The first nitride semiconductor conductive layer 20 or second nitride semiconductor conductive layer 40 is made from the material selected from the groups consisting of: AlN, GaN, InN, AlGaN, InGaN and InAlGaN. The uneven multiple quantum well 30 is made from the material selected from the groups consisting of: AlN, GaN, InN, AlGaN, InGaN and InAlGaN. Besides, the exemplary uneven multiple quantum well 30 has a cross section with a ratio of width to height in a range between 3 to 1 and 1 to 10 and has a surface roughness Ra in a range between 0.5 and 50 nanometers. Preferably, the surface roughness Ra is in the range between 30 and 40 nanometers.

It is noted that, an epi-structure of light-emitting device with uneven multiple quantum well in the present invention is capable of emitting different lights through different percentages of compound materials for forming active layer 30 with MQW. The emitted lights include ultraviolet light, visible light and infrared light. For example, when the compound material for forming the active layer 30 is added into phosphorous (P) or arsenic (As) compound or phosphorous arsenide, infrared light, red light or yellow light may be emitted.

When the compound material for forming the active layer 30 is added into nitrogen (N), ultraviolet light, blue light or green light may be emitted.

Figure 4:
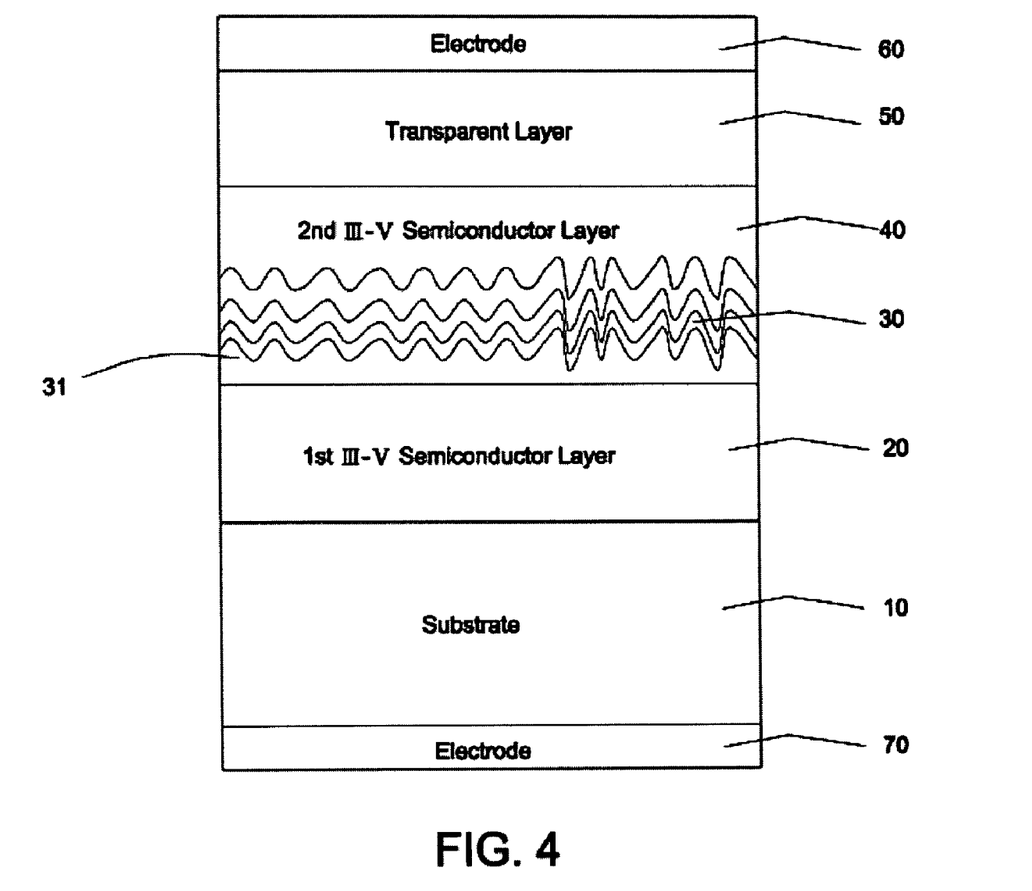
FIG. 4 is a cross-sectional diagram illustrating a light-emitting device according to the present invention.

FIG. 4 is a cross sectional diagram illustrating a light-emitting device with uneven multiple quantum well according to the present invention. In the embodiment, the structure of light-emitting device is similar to the aforementioned embodiment and not illustrated for brief.

First, a substrate 10 is positioned in the reactor of MOVPE where hydrogen is filled into, and the temperature of the substrate 10 is raised to 1050☐ for cleaning the substrate 1. Next, the temperature of the reactor is maintained at 1050☐, and a mixture gas containing TMG gas, ammonia and siliane-implanting gas is past into the reactor for forming a first nitride semiconductor conductive layer 20 on the substrate 1. When the first nitride semiconductor conductive layer 20 is an n-GaN semiconductor conductive layer, its Si impurity concentration is from $2\times10^{16}/cm^3$ to $8\times10^{21}/cm^3$, and the growth thickness of the n-GaN semiconductor conductive layer is about from 1.5 to 3 μm. It is noted that the first nitride semiconductor conductive layer 20 may be the semiconductor conductive layer made from nitride material, for example, when the first nitride semiconductor conductive layer 20 is made from InAlGaN material, it may be construed by $In_xAl_yGa_{1-x-y}N$ (0☐x, 0☐y, x+y☐1), whose content is not limited to. However, for acquirement of the nitride semiconductor layer with less crystal defects, the y value may be from 0.15 to 0.2. Besides, the thickness of the first nitride semiconductor conductive layer 20 is not limited to. For the formation of an n-electrode layer, the thickness of the first nitride semiconductor conductive layer 20 is preferably over 1 μm. Furthermore, for the prevention of nitride semiconductor from crystallite degradation, its N-type impurity concentration is preferably in a higher concentration range of $1\times10^{17}/cm^3$ to $5\times10^{21}/cm^3$.

Next, the temperature of the reactor is maintained at 1050☐, and a plurality of the particles made from at least one hetero-material are added into the reactor to randomly scatter the particles made from the added hetero-material on the first nitride semiconductor conductive layer 20. The hetero-material of the added particles is different from one of the first nitride semiconductor conductive layer 20, for example, when the nitride semiconductor conductive layer 20 is made from the GaN material, the hetero-material may be the III group in the periodic table including: boron (B), aluminum (Al), gallium (Ga), indium (In), thallium (Tl) or the V group in the periodic table including: nitrogen (N), phosphorous (P), arsenic (As), antimony (Sb), bismuth (Bi) or the II group in the periodic table including: beryllium (Be), magnesium (Mg), calcium (Ca), strontium (Sr), barium (Ba), radium (Ra) or the VI group in the periodic table including: oxygen (O), sulfur (S), selenium (Se), tellurium (Te), barium (Po) or the II-V group compound, II-VI group compound or II-V group compound (such as $Mg_3N_2$) or silicon nitride ($SiN_x$) or zinc nitride ($Zn_3N_2$), and so on.

Figure 8:
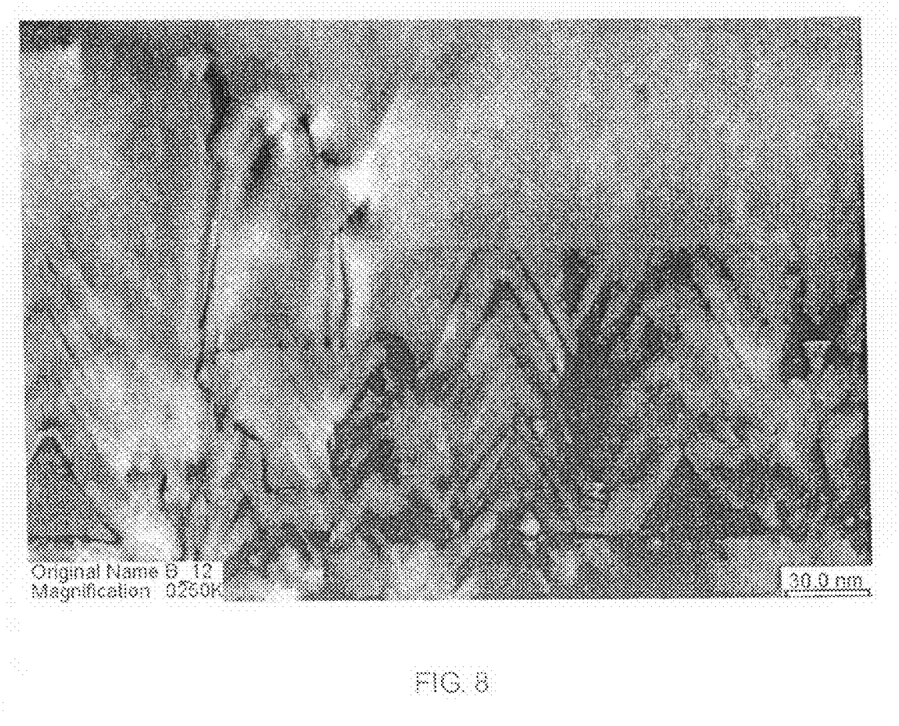
FIG. 8 shows a SEM diagram of uneven multiple quantum well according to the present invention.

After the particles made from the hetero-material are scattered on the first nitride semiconductor conductive layer 20, a nitride semiconductor conductive layer without implantation first grows in the thickness about 100 to 200 Angstroms configured for a barrier layer. Next, the temperature is maintained at about 800☐, and TMG, TMI and ammonia flow into the reactor for forming nitride semiconductor conductive layer without implantation in the thickness about 20 to 30 Angstroms, for example, the well layer of $In_{0.4}Ga_{0.6}N$. Next, the structure of the multiple quantum well is laminated by forming in order barrier and well layer, such as 5 layers of the barrier layer and 4 layers of well layer. Thus, the active layer 30 with the multiple quantum well in the thickness of 1120 Angstroms grows, shown in the SEM diagram of FIG. 8. Besides, though the active layer 30 is laminated from the barrier layer, however, the laminated order may be started from one well layer and stopped at another well layer, or started from one well layer and stopped at one barrier layer, or started from one barrier layer and stopped at one well layer, but not limited to. The thickness of one well layer is below 100 Angstroms, better below 70 Angstroms, and preferably below 50 Angstroms. Furthermore, the thickness of the barrier layer should be below 300 Angstroms, better below 250 Angstroms and preferably below 200 Angstroms.

Before the growth of the active layer 30 with multiple quantum well, some positions on the nitride semiconductor conductive layer 20 have been covered by the added hetero-material, thus, the positions may block the growth of the multiple quantum well or decrease the growth rate of the multiple quantum well during the growth of the multiple quantum well. Under the condition aforementioned, there are cavities, such as unevenness 31, formed on the positions in the existence of the hetero-material. The plurality of the unevenness 31 are similar to an area of sand dune on a beach, which have individual height and width and may not connected each another, referring to a SEM of FIG. 7. In the present invention, the exemplary uneven multiple quantum well 30 has a cross section with a ratio of width to height in a range between 3 to 1 and 1 to 10, and has a surface roughness Ra in a range between 0.5 and 50 nanometers. Preferably, the surface roughness Ra is in the range between 30 and 40 nanometers, referring to the AFM diagram of FIG. 8.

Next, the temperature of the reactor is maintained at 1050☐, and TMG, ammonia and Cp2Mg enter into the reactor for forming second nitride semiconductor conductive layer 40 of P-type nitrogen compound. The second nitride semiconductor conductive layer 40 has a dual implant concentration from 1 to $3\times10^{20}/cm^3$, such as Mg, and the thickness of the second nitride semiconductor conductive layer 40 is about 600 to 1000 Angstroms. In the embodiment, the second nitride semiconductor conductive layer 40 is made from GaN or $In_xAlyGa_{1-x-y}N$ (0☐x, 0☐y, x+y☐1), but the composition is not limited to. However, for acquirement of the nitride semiconductor layer with less crystal defects and good ohmic contact on the P-type electrode, GaN is preferably adopted.

After the second nitride semiconductor conductive layer 40 is formed, the reactor is cooled down and the epi-structure is picked out of the reactor. A pattern in a specific shape is pattern-transferred onto the surface of the second nitride semiconductor conductive layer 40. Next, an etching step is executed in the apparatus of RIE. After etching step, a transparent conductive layer 50 is formed over the second nitride semiconductor conductive layer 40. The thickness of the transparent conductive layer 50 is about 100 to 500 Angstroms, and the material of the transparent conductive layer 50 may be TiN, NiO/Au, Ta/Au, TiWN, Ni/Au alloy or ITO, Chromium Tin Oxide, Antimony Tin Oxide (ATO), Znic Aluminum Oxide and Znic Tin Oxide, and so on. Next, a second electrode 60 with the thickness of 0.2~0.5 μm is formed on the transparent conductive layer 50. Because the second nitride semiconductor conductive layer 40 is a P-type nitride semiconductor conductive layer, the material of the second electrode 60 may be made from Au/Ge/Ni alloy. Next, a first electrode 70 is formed on the substrate 10, whose material may be Au/Ge/Ni alloy or W/Al alloy. A physical LED device is formed by the methods aforementioned and the know method of electrode for light-emitting device is not illustrated for brief.

It is noted that, the LED device of the present invention utilizes the active layer 30 made from nitride and may emit blue light or green light or ultraviolet light. Furthermore, the light-emitting device with uneven multiple quantum well of the present invention may emit different light according to the different percentages of compound materials for forming active layer 30 with multiple quantum well, for example, the compound material for the active layer 30 is added with phosphorous (P) or arsenide or phosphorous arsenide for emitting red light or yellow light or infrared light.

Figure 5:
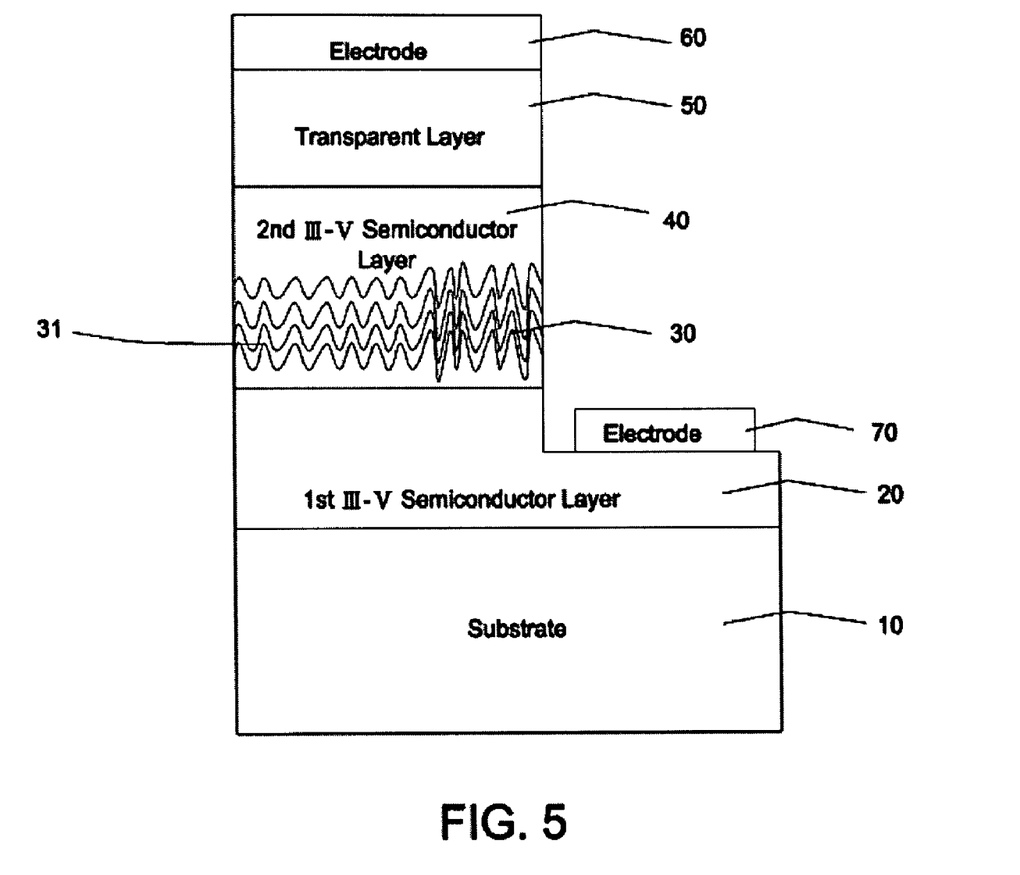
FIG. 5 is a cross-sectional diagram illustrating another light-emitting device according to the present invention.

Besides, for a known LED device, after the formation of epi-structure of a light-emitting device, some portions of the second nitride semiconductor conductive layer 40, active layer 30 and the first nitride semiconductor conductive layer 20 are removed by etching the partial epitaxy layer of the light-emitting device, and then the transparent layer 50, electrode 60 and electrode 70 are formed respectively, shown in FIG. 5. The light-emitting device in FIG. 5 is similar to one in FIG. 4 and known difference is not illustrated for brief.

Obviously, according to the illustration of embodiments aforementioned, there may be modification and differences in the present invention. Thus it is necessary to understand the addition of claims. In addition of detailed illustration aforementioned, the present invention may be broadly applied to other embodiments. Although the present invention has been explained in relation to its preferred embodiment, it is to be understood that other modifications and variation can be made without departing the spirit and scope of the invention as hereafter claimed.

What is claimed is:

1. An epi-structure applied to a light-emitting device, comprising:
    a substrate;
    a first semiconductor conductive layer formed on said substrate;
    an active layer formed on said first semiconductor conductive layer, wherein said active layer has a plurality of uneven multiple quantum wells; and
    a second semiconductor conductive layer formed on said active layer;
    wherein a plurality of particles made from at least one hetero-material are scattered between said first semiconductor conductive layer and said active layer and configured for formation of said uneven multiple quantum well.

2. An epi-structure according to claim 1, wherein each one of said uneven multiple quantum well has a cross section with a ratio of width to height in a range between 3 to 1 and 1 to 10.

3. An epi-structure according to claim 1, wherein said substrate is made from a material selected from the groups consisting of sapphire, GaN, SiC, GaAs, AlN, GaP, Si, ZnO, MgO and glass material.

4. An epi-structure according to claim 1, wherein said first semiconductor conductive layer is an N-Type semiconductor layer.

5. An epi-structure according to claim 1, wherein said first semiconductor conductive layer is made from a material selected from the groups consisting of AlN, GaN, InN, AlGaN, InGaN and InAlGaN.

6. An epi-structure according to claim 1, wherein said multiple quantum well is made from a material selected from the groups consisting of AlN, GaN, InN, AlGaN, InGaN and InAlGaN.

7. An epi-structure according to claim 1, wherein said second semiconductor conductive layer is a P-Type semiconductor layer.

8. An epi-structure according to claim 1, wherein said second semiconductor conductive layer is made from a material selected from the groups consisting of AlN, GaN, InN, AlGaN, InGaN and InAlGaN.

9. An epi-structure according to claim 1, wherein said particles made from the hetero-material comprise a hetero-material different from the first semiconductor conductive layer.

10. An epi-structure according to claim 1, wherein said particles made from the hetero-material are made from a material selected from the groups consisting of II group, III group, V group, VI group, III-V group compound, II-V group compound and II-VI group compound.

11. An epi-structure according to claim 1, wherein each one of said uneven multiple quantum well has a surface roughness Ra in a range between 0.5 and 50 nanometers.

12. An epi-structure according to claim 11, wherein each one of said uneven multiple quantum well has the surface roughness Ra in the range between 30 and 40 nanometers.

13. A light-emitting device, comprising:
    a first electrode;
    a substrate formed on said first electrode;
    a first semiconductor conductive layer formed on said substrate;
    an active layer formed on said first semiconductor conductive layer, wherein said active layer have a plurality of uneven multiple quantum well;
    a second semiconductor conductive layer formed on said active layer;
    a transparent conductive layer formed on said second semiconductor conductive layer; and
    a second electrode formed on said transparent conductive layer;
    wherein a plurality of particles made from at least one hetero-material are scattered between said first semiconductor conductive layer and said active layer and configured for formation of the uneven multiple quantum well.

14. A light-emitting device according to claim 13, wherein the multiple quantum well is made from a material selected from the groups consisting of AlN, GaN, InN, AlGaN, InGaN and InAlGaN.

15. A light-emitting device according to claim 13, wherein the transparent conductive layer is made from a material selected from the groups consisting of Ni/Au, NiO/Au, Ta/Au, TiWN, TiN, Indium Tin Oxide, Chromium Tin Oxide, Antimony Tin Oxide, Znic Aluminum Oxide and Znic Tin Oxide.

16. A light-emitting device according to claim 13, wherein the particles made from the hetero-material comprise a hetero-material different from the first semiconductor conductive layer.

17. A light-emitting device according to claim 16, wherein the particles made from the hetero-material are made from a material selected from the groups consisting of II group, III group, V group, VI group, III-V group compound, II-V group compound and II-VI group compound.

18. A light-emitting device according to claim 13, wherein the uneven multiple quantum well are made from a nitride material.

19. A light-emitting device according to claim 13, wherein the uneven multiple quantum well is phosphide, arsenide, or phosphorous arsenide material.

20. An epi-structure, which has a plurality of uneven multiple quantum well, comprising: a semiconductor conductive layer formed on a substrate and a multiple quantum well layer formed on said semiconductor conductive layer to form an epi-structure of multiple quantum well, wherein the characteristics of said epi-structure are on:

at least one hetero-material are scattered between said first semiconductor conductive layer and said multiple quantum well layer and configured for formation of the uneven multiple quantum well.

21. An epi-structure according to claim 20, wherein the multiple quantum well is made from a material selected from the groups consisting of AlN, GaN, InN, AlGaN, InGaN and InAlGaN.

22. An epi-structure according to claim 20, wherein particles made from the hetero-material comprise a hetero-material different from the semiconductor conductive layer.

23. An epi-structure according to claim 22, wherein the particles made from the hetero-material are made from a material selected from the groups consisting of II group, III group, V group, VI group, II-V group compound, II-V group compound and II-VI group compound.

24. An epi-structure according to claim 20, wherein the uneven multiple quantum well are made from a nitride material.

* * * * *